(12) United States Patent
Bleeker et al.

(10) Patent No.: US 7,411,652 B2
(45) Date of Patent: Aug. 12, 2008

(54) LITHOGRAPHIC APPARATUS AND DEVICE MANUFACTURING METHOD

(75) Inventors: Arno Jan Bleeker, Westerhoven (NL); Dominicus Jacobus Petrus Adrianus Franken, Veldhoven (NL); Peter C. Kochersperger, Easton, CT (US); Kars Zeger Troost, Waalre (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 189 days.

(21) Appl. No.: 10/946,333

(22) Filed: Sep. 22, 2004

(65) Prior Publication Data

US 2005/0068510 A1    Mar. 31, 2005

Related U.S. Application Data

(63) Continuation-in-part of application No. 10/677,242, filed on Oct. 3, 2003.

(30) Foreign Application Priority Data

Sep. 22, 2003   (EP) .................................. 03255906

(51) Int. Cl.
  *G03B 27/42*   (2006.01)
  *G03B 27/62*   (2006.01)
(52) U.S. Cl. .......................................... 355/53; 355/75
(58) Field of Classification Search .................. 355/53, 355/55, 67, 72–76; 430/5, 20, 30; 359/291–292
  See application file for complete search history.

(56) References Cited

U.S. PATENT DOCUMENTS

| | | | |
|---|---|---|---|
| 4,475,223 A * | 10/1984 | Taniguchi et al. ............. 378/34 |
| 4,666,291 A * | 5/1987 | Taniguchi et al. ............. 355/52 |
| 4,737,824 A * | 4/1988 | Sakai et al. .................... 355/53 |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A * | 6/1996 | Nelson ........................ 430/311 |
| 5,530,482 A | 6/1996 | Gove et al. | |
| 5,579,147 A | 11/1996 | Mori et al. | |
| 5,677,703 A | 10/1997 | Bhuva et al. | |

(Continued)

FOREIGN PATENT DOCUMENTS

EP    1 139 176    10/2001

(Continued)

OTHER PUBLICATIONS

European Search Report for European Appln. 03255906.4-1226 mailed Aug. 30, 2004.

(Continued)

*Primary Examiner*—Hung Henry Nguyen
(74) *Attorney, Agent, or Firm*—Sterne, Kessler, Goldstein & Fox P.L.L.C.

(57) ABSTRACT

One or more patterning arrays are mounted to a mounting plate via height adjustment structures that enable the flatness of the active surfaces of the patterning arrays to be controlled. The height adjustment structures may comprise an array of piezoelectric actuators or screws. Alternatively, the backside of the patterning means may be polished to optical flatness and bonded by crystal bonding to an optically flat surface of a rigid mounting body.

14 Claims, 14 Drawing Sheets

U.S. PATENT DOCUMENTS

| | | |
|---|---|---|
| 5,808,797 A | 9/1998 | Bloom et al. |
| 5,883,703 A * | 3/1999 | Knirck et al. ................ 355/55 |
| 5,982,553 A | 11/1999 | Bloom et al. |
| 6,133,986 A | 10/2000 | Johnson |
| 6,177,980 B1 | 1/2001 | Johnson |
| 6,229,871 B1 | 5/2001 | Tichenor |
| 6,356,340 B1 | 3/2002 | Spence |
| 6,379,867 B1 | 4/2002 | Mei et al. |
| 6,416,908 B1 | 7/2002 | Klosner et al. |
| 6,433,917 B1 | 8/2002 | Mei et al. |
| 6,509,955 B2 | 1/2003 | Mei et al. |
| 6,617,082 B2 | 9/2003 | Hutchinson |
| 6,618,185 B2 * | 9/2003 | Sandstrlom ................ 359/292 |
| 6,687,041 B1 | 2/2004 | Sandstrom |
| 6,696,008 B2 * | 2/2004 | Brandinger ................ 264/400 |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 2003/0210383 A1 | 11/2003 | Jain |
| 2004/0041104 A1 | 3/2004 | Liebregts et al. |
| 2004/0130561 A1 | 7/2004 | Jain |
| 2005/0007572 A1 | 1/2005 | George et al. |
| 2005/0046921 A1 | 3/2005 | Govil et al. |
| 2005/0074906 A1 | 4/2005 | Kochersperger et al. |

FOREIGN PATENT DOCUMENTS

| | | |
|---|---|---|
| EP | 1 271 247 A | 1/2003 |
| EP | 1 280 007 A | 1/2003 |
| JP | 2001-297982 A | 10/2001 |
| WO | WO 98/33096 | 7/1998 |
| WO | WO 98/38597 | 9/1998 |
| WO | WO 02/42825 A1 | 5/2002 |

OTHER PUBLICATIONS

European Search Report from European Patent Application No. 04255638.1, 7 pages, dated Mar. 16, 2005.

Office Action for Japanese Patent Application No. 2004-273338 mailed Jan. 8, 2008, 3 pgs.

Notice of Allowance mailed Jan. 10, 2008 for U.S. Appl. No. 10/677,242, 4 pgs.

* cited by examiner

LITHOGRAPHIC APPARATUS AND DEVICE MANUFACTURING METHOD

CROSS REFERENCE TO RELATED APPLICATIONS

This application is a continuation-in-part of U.S. Ser. No. 10/677,242, filed Oct. 3, 2003 which is now allowed, which is incorporated by reference herein in its entirety.

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

In conventional lithography apparatus using masks, stringent requirements are imposed on the global flatness of the mask to prevent telecentricity errors at the substrate. The relatively large demagnification M (e.g., a reduction by a factor of, for example, about 200-400) used in maskless lithography apparatus (i.e., lithography apparatus using a patterning array) exacerbates the problem. The global unflatness U (i.e., unflatness over a period of about 10 or more mirrors) translates into a telecentricity error TE at wafer level according to the formula:

$$TE = 2*M*U \quad (1)$$

Accordingly, a global unflatness of 40 µrad, typical for a patterning array, yields a telecentricity error of 16-32 mrad compared to a normal specification of 10 mrad total.

Furthermore, as maskless lithography capabilities increase, the tolerance for error in an exposure decreases. One of the errors that can occur in an exposure are optical aberrations in the exposure optics, which are typically caused by manufacturing and assembly tolerance in the exposure optics. Aberrations can result in total focus deviation, among other exposure errors. Total focus deviation results when a focal length of the exposure optics is not identical in all areas of the exposure beam. In this case, a flat patterning array assembly does not focus onto a flat plane at the image or wafer plane. When the optics are changed to correct for the error, movement of the optics components requires great precision. Otherwise, difficulties arise that can introduce additional error into the system.

Therefore, what is needed is a system and method for reducing aberrations without introducing additional error into the maskless system. Also, what is needed is an arrangement for mounting one or more patterning arrays such that unflatness of the patterning arrays can be reduced.

SUMMARY

According to an embodiment of the invention, there is provided a lithographic apparatus comprising an illumination system, a patterning array, a mounting plate, a height adjustment structure, a substrate table, and a projection system for supplying a beam of radiation. The patterning array of individually controllable elements imparts the beam with a pattern in its cross-section. The patterning array is mounted on a mounting plate. The height adjustment structure locally adjusts the height of the active surface of said patterning array. The substrate table supports a substrate. The projection system projects the patterned beam onto a target portion of the substrate.

According to another embodiment of the invention, there is provided a lithographic apparatus comprising an illumination system, a patterning array, a substrate table, and a projection system. The illumination system supplies a beam of radiation. The patterning array includes individually controllable elements serving to impart the beam with a pattern in its cross-section. The substrate table supports a substrate. The projection system projects the patterned beam onto a target portion of the substrate. The patterning array comprises a plurality of active elements disposed on a first surface of a substrate, a second surface of the substrate opposite the first substrate being optically flat; and a rigid mounting body having an optically flat surface to which the second surface of the substrate is bonded.

According to a further aspect of the invention there is provided a device manufacturing method comprising the following steps. Providing a substrate that is at least partially covered by a layer of radiation sensitive material. Providing a beam of radiation using a radiation system. Using patterning array to endow the first beam with a pattern in its cross-section. Projecting the patterned beam of radiation onto a target portion of the layer of radiation-sensitive material. Mounting the patterning array to a mounting plate or rigid body in such a manner as to ensure the active surface thereof is flat.

In one example, corrections for total focus deviation are made by moving individual patterning arrays in a patterning array assembly. Instead of aligning all patterning arrays so that they define a flat patterning array assembly plane, at least one patterning array has the capability to deviate from the flat plane.

In one example, each patterning array in the patterning array assembly occupies a first position. Data is received at the wafer plane (also referred to herein as the image plane) so as to determine a corrective adjustment needed. On the basis of this determination, various patterning arrays in the patterning array assembly move out of the first position into a second position. Each patterning array is moved separately, if at all. This causes the patterning array assembly to deviate from a flat plane.

In this example, the movement of an individual patterning array from the first position to the second position can involve tilting, changing elevation, or bending. These changes are effected by an adjuster or set of adjusters attached to each patterning array. In one example, the adjusters change lengths in order to move their respective patterning arrays to the second positions. The adjusters may be actively or passively controlled. Actively controlled adjusters may include, for example, pistons. Passively controlled adjusters may include, for example, screws or bolts whose lengths are manually changed.

In this example, after individual patterning arrays have been moved to their second positions, light from an illumination system illuminates the patterning array assembly. The patterning array assembly reflects light through at least one optical system. The light then exposes an object at the image plane.

In one example, aberrations such as total focus deviation can be reduced without making high-precision adjustments to lenses in the optical system. Also, correcting aberrations with the patterning arrays allows a less stringent specification for the optics when the system is built.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE EMBODIMENTS

Terminology

Figure 1:
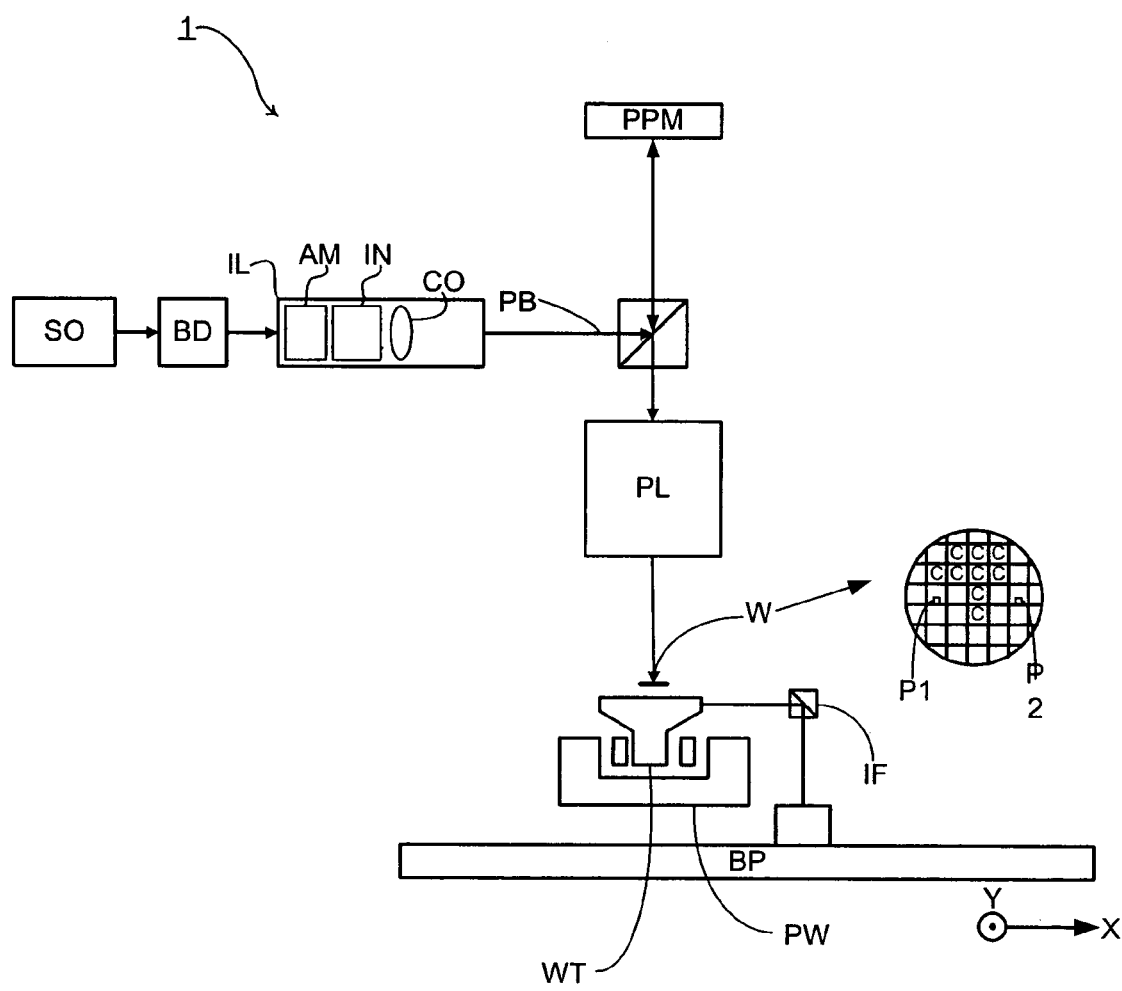
FIG. 1 depicts a lithographic apparatus, according to one embodiment of the invention.

The term "array of individually controllable elements" as here employed should be broadly interpreted as referring to any means that can be used to endow an incoming radiation beam with a patterned cross-section, so that a desired pattern can be created in a target portion of the substrate; the terms "light valve" and "Spatial Light Modulator" (SLM) can also be used in this context. Examples of such patterning means include, but are not limited to, a programmable mirror array and a programmable liquid crystal device (LCD) array.

A programmable mirror array may comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate.

An array of diffractive optical MEMS devices can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors.

The matrix addressing can be performed using suitable electronic means. In the examples described above, the array of individually controllable elements can comprise one or more programmable mirror arrays. More information on mirror arrays can be found, for example, from U.S. Pat. Nos. 5,296,891 and 5,523,193, and PCT patent applications WO 98/38597 and WO 98/33096, which are incorporated herein by reference.

An example programmable LCD array is shown in U.S. Pat. No. 5,229,872, which is incorporated herein by reference.

It should be appreciated that where pre-biasing of features, optical proximity correction features, phase variation techniques, and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures, during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including, but not necessarily limited to, ultraviolet (UV) radiation (e.g. having a wavelength of 408, 355, 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the array of individually controllable elements and the first element of the projection system. Immersion techniques are well known in the art for increasing the numerical aperture of projection systems.

Exemplary Environment

FIG. 1 schematically depicts a lithographic projection apparatus, according to one embodiment of the invention. The apparatus comprises an illumination system (illuminator) IL, an array of individually controllable elements PPM, a substrate table WT for supporting a substrate W, and a projection system ("lens") PL.

Illumination system (illuminator) IL provides a beam PB of radiation (e.g., UV radiation).

The array of individually controllable elements PPM (e.g., a programmable mirror array) patterns the beam. In one example, the position of the array of individually controllable elements will be fixed relative to projection system PL. In another example, it may instead be connected to a positioning means for accurately positioning it with respect to projection system PL.

As discussed above, the substrate table WT (e.g., a wafer table) supports the substrate W (e.g., a resist-coated wafer). The substrate table WT is also connected to a positioning means PW for accurately positioning the substrate with respect to projection system PL.

The projection system ("lens") PL images a pattern imparted to the beam PB by the array of individually controllable elements PPM onto a target portion C (e.g., comprising one or more dies) of the substrate W. In one example, the projection system PL may image the array of individually controllable elements PPM onto the substrate W. In anther example, the projection system PL may image secondary sources, for which the elements of the array of individually controllable elements PPM act as shutters. The projection system PL may also comprise an array of focusing elements, such as a micro lens array (known as an MLA) or a Fresnel lens array. This can be done, for example, to form the secondary sources and to image microspots onto the substrate.

In the embodiment shown, the apparatus is of a reflective type (i.e., has a reflective array of individually controllable elements). However, in general, it may also be of a transmissive type, e.g., with a transmissive array of individually controllable elements.

The illuminator IL receives a beam of radiation from a radiation source SO. In one example, the source SO and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD. In this case the beam delivery system BD includes, but is not limited to, suitable directing mirrors and/or a beam expander. In other examples the source SO may be integral part of the apparatus, for example when the source is a mercury lamp. In this example, the source SO and the illuminator IL, together with the beam delivery system BD, if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator IL can be adjusted. In some examples the illuminator IL comprises various other components, such as an integrator IN and a condenser CO. The illuminator IL provides a conditioned beam of radiation, referred to as the beam PB, having a desired uniformity and intensity distribution in its cross-section.

The beam PB subsequently interacts with the array of individually controllable elements PPM. Having been reflected by the array of individually controllable elements PPM, the beam PB passes through the projection system PL, which focuses the beam PB onto a target portion C of the substrate W.

In one example, with the aid of a positioning means PW, and possibly an interferometric measuring means IF, the substrate table WT can be moved accurately, e.g., so as to position different target portions C in the path of the beam PB.

In one example, a positioning means PW for the array of individually controllable elements PPM can be used to accurately correct the position of the array of individually controllable elements PPM with respect to the path of the beam PB, e.g., during a scan.

In one example, movement of the substrate table WT is realized with the aid of a long-stroke module (course positioning) and a short-stroke module (fine positioning), which are not explicitly depicted in FIG. 1. A similar system may also be used to position the array of individually controllable elements PPM.

It will be appreciated that the beam PB may alternatively/additionally be moveable while the substrate table WT and/or the array of individually controllable elements PPM may have a fixed position to provide the required relative movement.

As a further alternative, that may be especially applicable in the manufacture of flat panel displays, the position of the substrate table WT and the projection system PL may be fixed and the substrate W may be arranged to be moved relative to the substrate table WT. For example, the substrate table WT may be provided with a system for scanning the substrate W across it at a substantially constant velocity.

Although the lithography The apparatus of the invention is herein described as being for exposing a resist on a substrate, it will be appreciated that the invention is not limited to this use and the apparatus may be used to project a patterned beam for use in resistless lithography.

The depicted apparatus can be used in four one modes: a step mode, a scan mode, a pulse mode, and a continuous scan mode.

In a Step mode, the array of individually controllable elements PPM imparts an entire pattern to the beam PB, which is projected onto a target portion C in one pass (i.e., a single static exposure). The substrate table WT is then shifted in the X and/or Y direction, so that a different target portion C can be exposed. In step mode, the maximum size of the exposure field limits the size of the target portion C imaged in a single static exposure.

In Scan mode, the array of individually controllable elements PPM is movable in a given direction (e.g., a "scan direction" or a Y direction) with a speed v, so that the beam PB is caused to scan over the array of individually controllable elements PPM. Concurrently, the substrate table WT is substantially simultaneously moved in the same or opposite direction at a speed V=Mv, in which M is the magnification of the lens PL. In scan mode, the maximum size of the exposure field limits the width (in the non-scanning direction) of the target portion C in a single dynamic exposure, whereas the length of the scanning motion determines the height (in the scanning direction) of the target portion C.

In Pulse mode, the array of individually controllable elements PPM is kept essentially stationary and the entire pattern is projected onto a target portion C of the substrate W using a pulsed radiation system. The substrate table WT is moved with an essentially constant speed, such that the beam PB is caused to scan a line across the substrate W. The pattern on the array of individually controllable elements PPM is updated as required between pulses of the radiation system. The pulses are timed such that successive target portions C are exposed at the required locations on the substrate W. Consequently, the beam PB scans across the substrate W to expose the complete pattern for a strip of the substrate W. The process is repeated until the complete substrate W has been exposed line by line.

Continuous scan mode is essentially the same as pulse mode except that a substantially constant radiation source is used and the pattern on the array of individually controllable elements PM is updated as the beam PB scans across the substrate W and exposes it.

Combinations and/or variations on the above described modes of use or entirely different modes of use may also be employed.

Exemplary Mounting Assemblies for a Patterning Array

Figure 2:
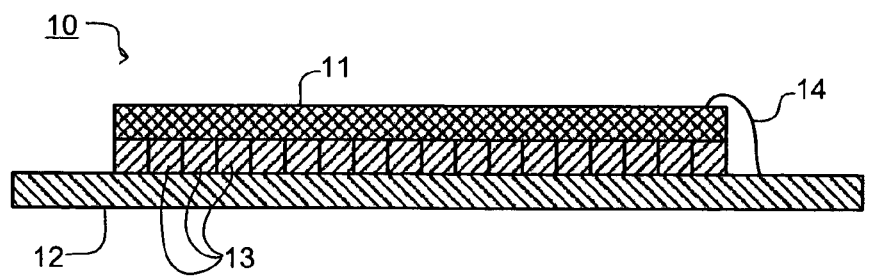
FIG. 2 depicts a patterning array and mounting, according to one embodiment of the invention.

FIG. 2 shows a mounting assembly, according to one embodiment of the present invention. A patterning array 11 (e.g., an array of programmable elements) is mounted on a rigid plate 12 to form a patterning array assembly 10. In one example, patterning array assembly 10 could replace PPM in FIG. 1. In one example, patterning array assembly 10 is mounted in a lithographic apparatus by a positioning means (not shown). Electrical connections to patterning array 11 can be made via rigid member or plate 12 and wires 14. Between patterning array 11 and rigid plate 12 is an array of piezoelectric elements 13. In one example, piezoelectric elements 13, when appropriately activated, distort patterning array 11 so as to correct the unflatness thereof to within the desired specification. In one example, piezoelectric elements 13 can be integrated into either patterning array 11 or mounting plate 12. In various examples, the array of piezoelectric elements 13 are 1-dimensional, if patterning array 11 is linear, or 2-dimensional, if pattering array 11 is a m×n matrix of elements. In one example, spacing in the array of piezoelectric elements 13 is in general much greater than a pitch of the pixels of the patterning array 11. In one example, the spacing is chosen according to the spatial frequency of the expected unflatness of patterning array 11.

In one example, piezoelectric elements 13 are arranged so that actuation thereof alters their length in the direction perpendicular to the nominal plane of the active surface of patterning array 11 so as to directly distort patterning array 11. In another example, it is also possible to use piezoelectric actuators that exert forces in the plane of patterning array 11 so as to alter its shape by control of tension and/or compression forces within it.

In one example, appropriate control signals to effect the required correction of the unflatness of patterning array 11 is determined during calibration, or recalibration, of the apparatus and applied whenever the apparatus is operating.

Figure 3:
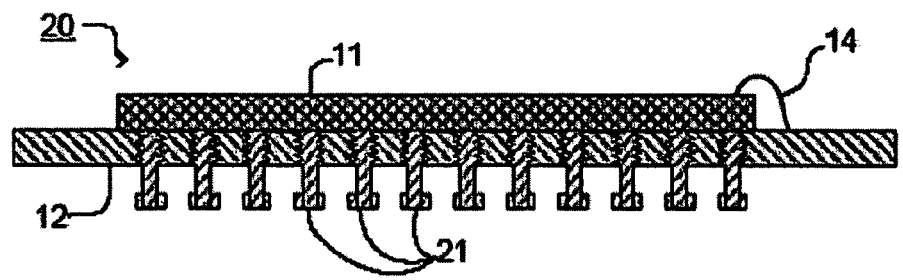
FIG. 3 depicts a patterning array and mounting assembly, according to one embodiment of the invention.

FIG. 3 shows an assembly 20, according to one embodiment of the present invention. In assembly 20, the piezoelectric actuators of FIG. 2 are replaced by an array of screws or bolts 21 provided in threaded through-holes in rigid plate 12 and bearing against the backside of patterning array 11 so that they can be adjusted to alter the shape of patterning array 11. In one example, adjustment of the screws or bolts 21 is performed during calibration, or recalibration, of the apparatus but is then set without need for further action.

Figure 4:
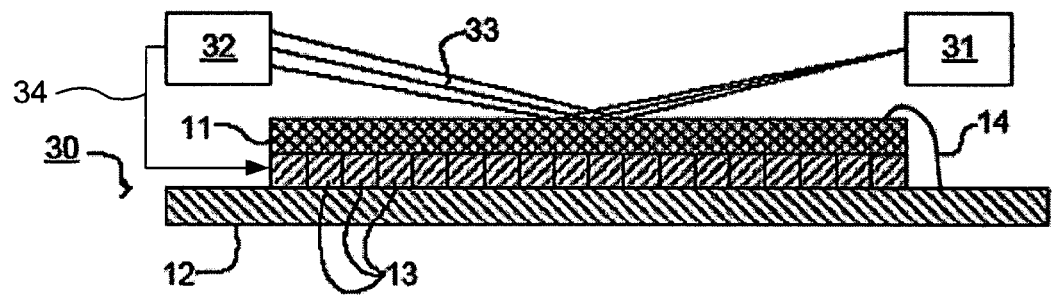
FIG. 4 depicts a patterning array and mounting assembly, according to one embodiment of the invention.

FIG. 4 shows another assembly, according to one embodiment of the present invention. In this embodiment, active control of the shape of patterning array 11 is provided. A level sensor system uses a beam source 31 to direct a beam 33 at an acute angle to patterning array 11 so that beam 33 is reflected to a sensor 32. Sensor 32 detects unflatness of patterning array 11 by virtue of the position at which beam 33 is incident on sensor 32. In one example, beam 33 has a footprint larger than a pixel of patterning array 11 so that the overall flatness of patterning array 11 is detected, rather than the angle of an individual mirror (not shown), in the case where patterning array 11 is a deformable mirror device, which are described above and below in more detail. When using such a device, it is also desirable to make the measurements of flatness during the period between pulses of the radiation source LA, when the mirrors of the device are in the rest state.

In one example, the results of the measurement of the flatness of the patterning array 11 are used in a feedback loop 34 to control piezoelectric actuators 13 so that the patterning array 11 achieves the desired flatness.

For an example spatial light modulator using piezoelectric actuators see U.S. Ser. No. 10/651,048 to Govil et al., entitled "Spatial Light Modulator Using An Integrated Circuit Actuator And Method Of Making And Using Same," which is incorporated by reference herein in its entirety.

Of course, other passive or active actuators may be used to adjust the flatness of patterning array 11. For example, patterning array 11 be mounted on a plurality of rods of a material with a reasonably high thermal coefficient of expansion, a heating coil is wound about each rod and the coils are selectively energized to cause selective heating and hence selective expansion of the rods. Thermal elements mounted in or on the mounting plate may also be used, as can actuators operating on pneumatic, magnetic or hydraulic principles. Furthermore, patterning array 11 may be mounted on the ends of a plurality of rods or pins, the other ends of which are interconnected by a plurality of actuators of any of the above mentioned types. By controlling the forces acting between the ends of the rods, local bending moments can be induced in patterning array 11 to improve its flatness.

In another embodiment of the present invention, an assembly is similar to those described above, except in the mounting of the patterning array 11, as described below. This aspect of the invention represents an alternative solution to the problem addressed by the invention. Rather than providing a height adjustment structure for adjusting the flatness of the patterning means, its flatness is assured by polishing its rear surface to optical flatness (e.g. less than about 0.1 μm) and then mounting it on a relatively rigid body that has also been ground to the same degree of flatness. The rigid body needs to be sufficiently rigid to assure the flatness is maintained during use of the apparatus.

In various examples, suitable material types for polishing to optical flatness are glass or ceramic. Specific materials that could be used are Zerodur, made by Schott A G of Germany, ultra low expansion (ULE) material made by Präzisions Glas & Optik GmbH of Germany, or similar.

The rigid body can be mounted via a fixed or active mount that is able to correct the global tilt of the patterning means. In one example, the rigid mounting body is mounted along its neutral line so that the patterning means is not distorted in the event of thermal expansion or contraction of the mounting body. The neutral line is a line through a body which has the property that when pulling force is exerted on the line, the body only elongates and does not bend. An example of this would be in a bar which is symmetric, the neutral line runs along the center of the bar.

It is also possible to have a neutral plane which has the same properties.

In one example, the bonding between the substrate of the programmable patterning means and the holding body is as strong as possible. In one example, a bonding technique is direct crystal bonding ("ansprengen") achieved by ensuring that the surfaces to be bonded are completely clean and flat before being brought into contact such that the two crystal structures bond.

Figure 5:
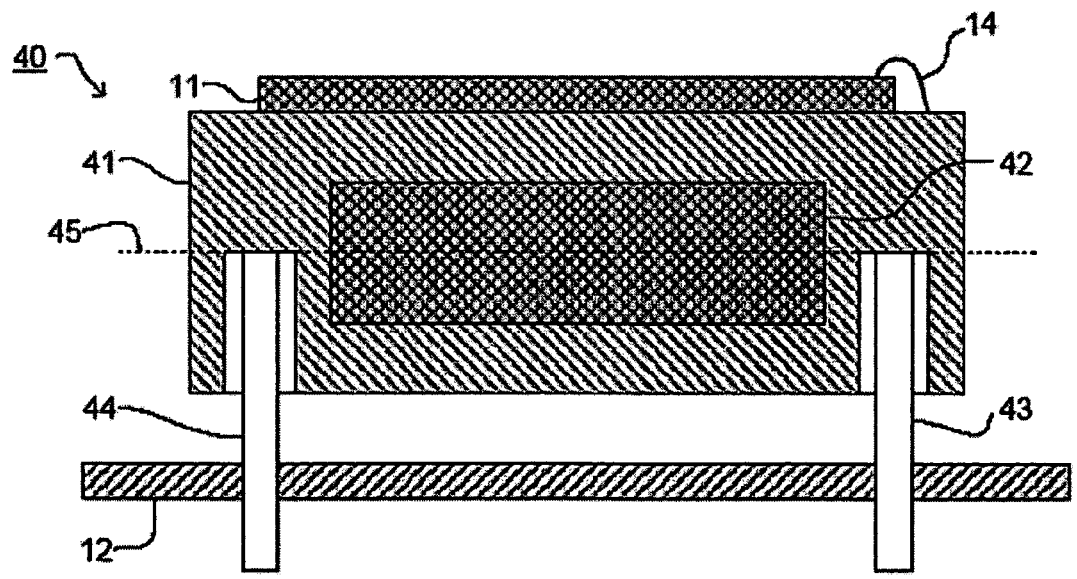
FIG. 5 depicts a patterning array and mounting assembly, according to one embodiment of the invention.

In this embodiment, as shown in FIG. 5, the desired flatness of patterning array 11 is achieved by polishing the backside of patterning array 111 to optical flatness during its manufacture and bonding it to a similarly polished surface of a rigid body 41. To enable direct crystal bonding (e.g., ansprengen) between patterning array 11 and rigid body 41, the surface roughness of the two surfaces should be less than 0.1 μm. In one example, rigid body 41 carries control or power supply electronic circuitry 42 for patterning array 11. Circuitry 42 may be provided on the side or bottom of rigid body 41. Rigid body 41 is mounted to the main plate of the patterning array assembly 40 by actuators or pivots 43, 44 (e.g., up to three or more pivots or actuators), which allow its global tilt to be set or controlled as required.

In one example, patterning array 11 is bonded to rigid body 12 using "verennest." A verennest comprises a large number of small flexible elements, usually identical, and usually of metal. By the use of many elements, a uniformly distributed force can be achieved regardless of local unflatness or thickness variation of the object to be clamped. Thus a plurality of small individual spring members is achieved, each with a relatively small spring force, are used around the edge of patterning array 11 to clamp it to rigid body 12. Three stops may be provided to limit in plane movements of the patterning array.

In one example, patterning array 11 is glued to rigid body 12 using a glue containing glass spheres or pearls of carefully calibrated diameter. In various examples, the glass spheres can be 8, 50, 100, and/or 200 microns, or up to about 2 mm or more. Any given glue would only contain one side of glass sphere. In one example, the size of the sphere would dictate the thickness of the glue layer. For example, if the spheres are 8 microns in diameter then this will force the glue layer to be 8 microns thick. In another example, the spheres are 10 microns in diameter. It is to be appreciated that other sphere sizes could be used to obtain different thicknesses of glue layers. For example, the glue is applied in a large number of small spots. In one example, the thickness of the glue layer can be controlled to a very constant value, e.g. about 10-50 micron±1 micron.

Figure 6:
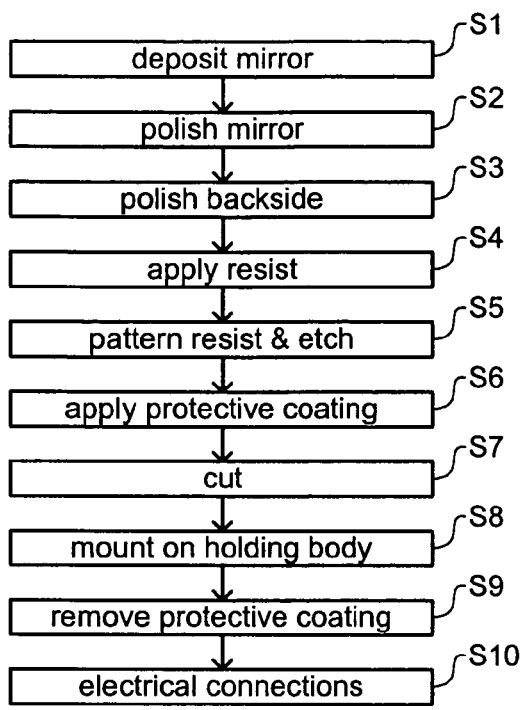
FIG. 6 is a flow diagram of a manufacturing process for producing a patterning array and mounting assembly, according to one embodiment of the invention.

FIG. 6 is a flowchart depicting a method, according to one embodiment of the present invention. At step S1, a mirror is deposited. At step S2, the mirror is polished. At step S3, a backside is polished. At step S4, a resist is applied. At step S5, the resist is patterned and then etched. At step S6, a protective coating is applied. At step S7, the mirror is cut. At step S8, the mirror is mounted on a holding body. At step S9, the protective coating is removed. At step S10, electrical connections are coupled to the mirror.

Figure 7:
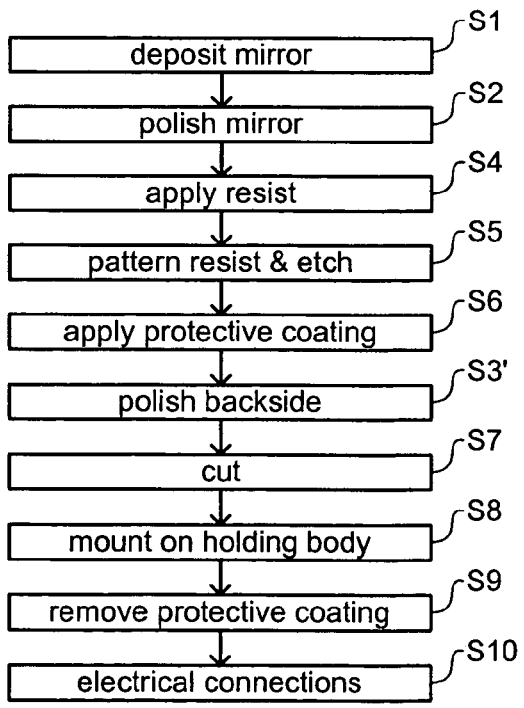
FIG. 7 is a flow diagram of a variant manufacturing process for producing a patterning array and mounting assembly, according to one embodiment of the invention.

FIG. 7 is a flowchart depicting a method, according to one embodiment of the present invention. At step S1, a mirror is deposited. At step S2, the mirror is polished. At step S4, a resist is applied. At step S5, the resist is patterned, and then etched. At step S6, a protective coating is applied. At step S3', the backside is polished. At step S7, the mirror is cut. At step S8, the mirror is mounted on a holding body. At step S9, the protective coating is removed. At step S10, electrical connections are coupled to the mirror.

Figure 8:
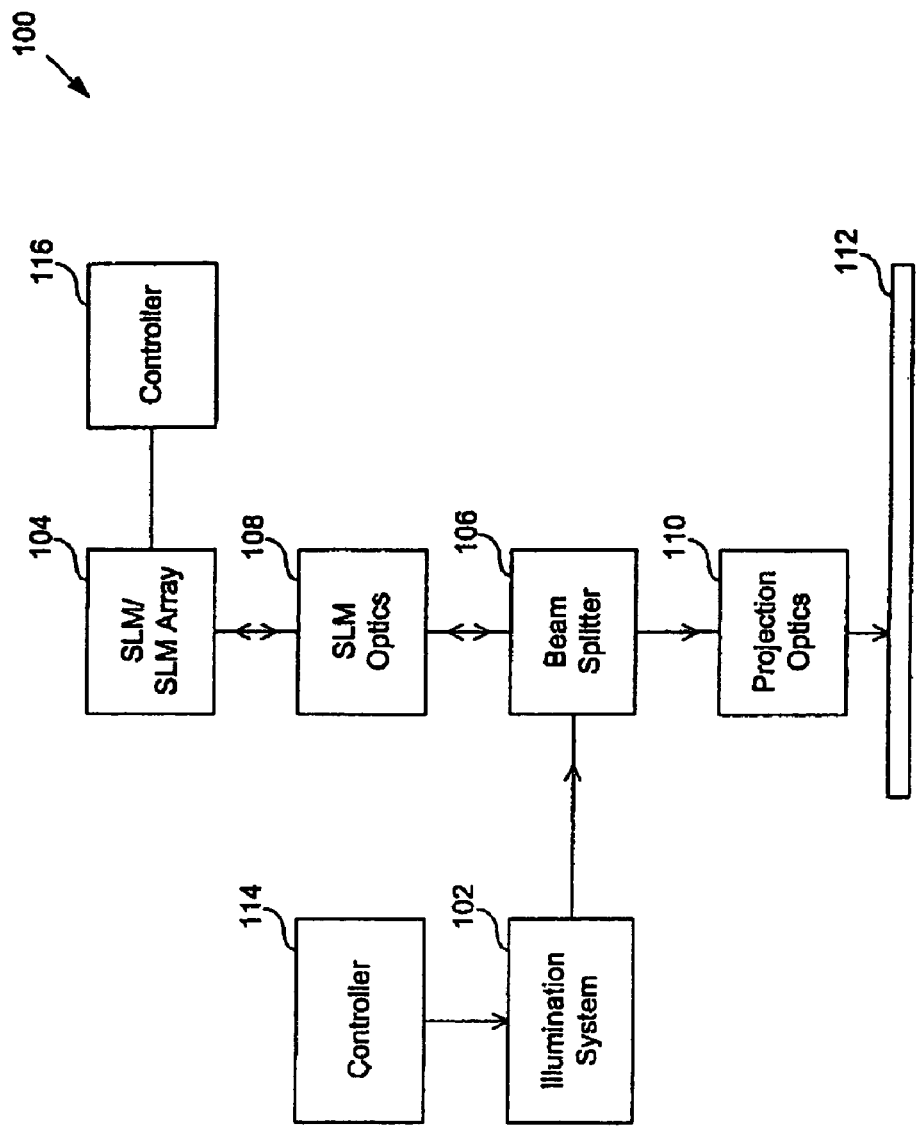
FIG. 8 is block diagram of a maskless lithography system having reflective patterning arrays, according to one embodiment of the invention.

FIG. 8 shows a maskless lithography system 100 according to an embodiment of the present invention. System 100 includes an illumination system 102 that transmits light to a reflective patterning array 104 (e.g., a digital micromirror device (DMD), a reflective liquid crystal display (LCD), or the like) via a beam splitter 106 and patterning array optics 108. Patterning array 104 is used to pattern the light in place of a reticle in traditional lithography systems. Patterned light reflected from patterning array 104 is passed through beam splitter 106 and projection optics 110 and written on an object 112 (e.g., a substrate, a semiconductor wafer, a glass substrate for a flat panel display, or the like).

It is to be appreciated that illumination optics can be housed within illumination system 102, as is known in the relevant art. It is also to be appreciated that patterning array optics 108 and projection optics 110 can include any combination of optical elements required to direct light onto desired areas of patterning array 104 and/or object 112, as is known in the relevant art.

In alternative embodiments, either one or both of illumination system 102 and patterning array 104 can be coupled to or have integral controllers 114 and 116, respectively. Controller 114 can be used to adjust illumination system 102 based on feedback from system 100 or to perform calibration. Controller 116 can also be used for adjustment and/or calibration. Alternatively, controller 116 can be used for switching pixels 302 on patterning array 104 between their discrete states (e.g., between one of their graytone states and the completely dark, or OFF state) (see FIG. 10). This can generate a pattern used to expose object 112. Controller 116 can either have integral storage or be coupled to a storage element (not shown) with predetermined information and/or algorithms used to generate the pattern or patterns.

Figure 9:
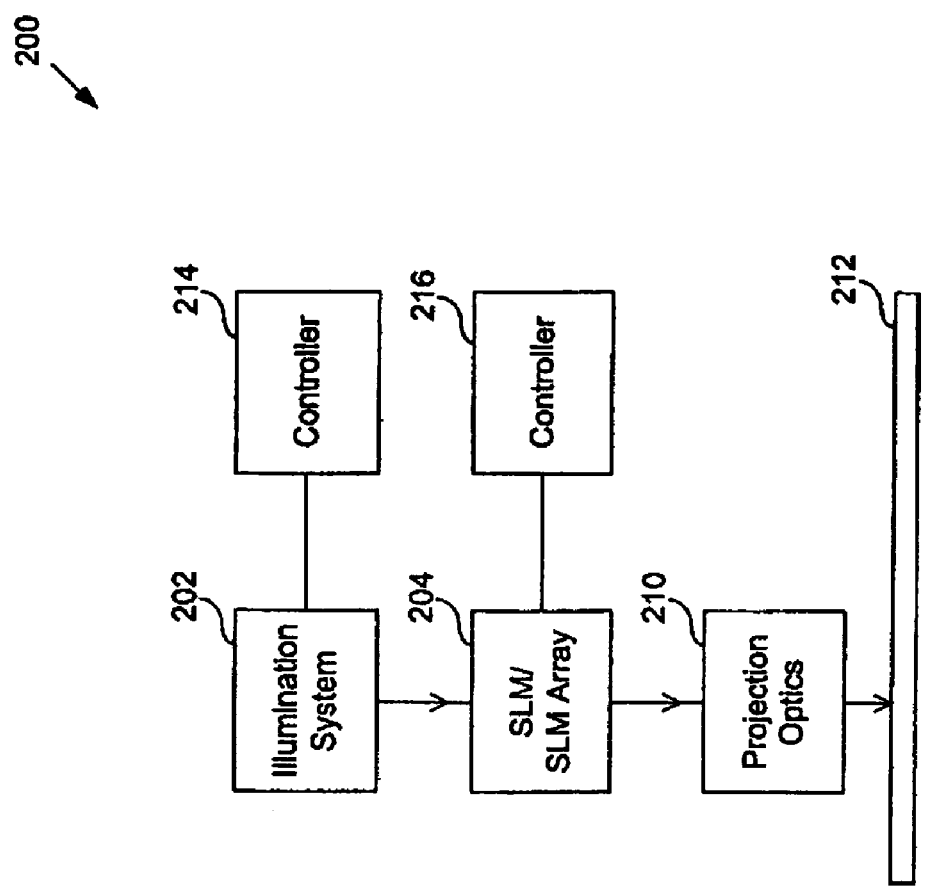
FIG. 9 is a block diagram of a maskless lithography system having transmission patterning arrays, according to one embodiment of the invention.

FIG. 9 shows a maskless lithography system 200 according to a further embodiment of the present invention. System 200 includes an illumination system 202 that transmits light through a patterning array 204 (e.g., a transmissive LCD, or the like) to pattern the light. The patterned light is transmitted through projection optics 210 to write the pattern on a surface of an object 212. In this embodiment, patterning array 204 is a transmissive patterning array, such as a liquid crystal display, or the like. Similar to above, either one or both of illumination system 202 and patterning array 204 can be coupled to or integral with controllers 214 and 216, respectively. Controllers 214 and 216 can perform similar functions as controller 114 and 116 described above, and as known in the art.

Example patterning arrays that can be used in either of systems 100 or 200 are manufactured by Micronic Laser Systems AB of Sweden and Fraunhofer Institute for Circuits and Systems of Germany.

Merely for convenience, reference will be made only to system 100 below. However, all concepts discussed below can also apply to system 200, as would be known to someone skilled in the relevant arts. Other arrangements or integration of the components and controllers of FIGS. 8 and 9 will become apparent to one of ordinary skill in the art without departing from the spirit and scope of the present invention.

Figure 10:
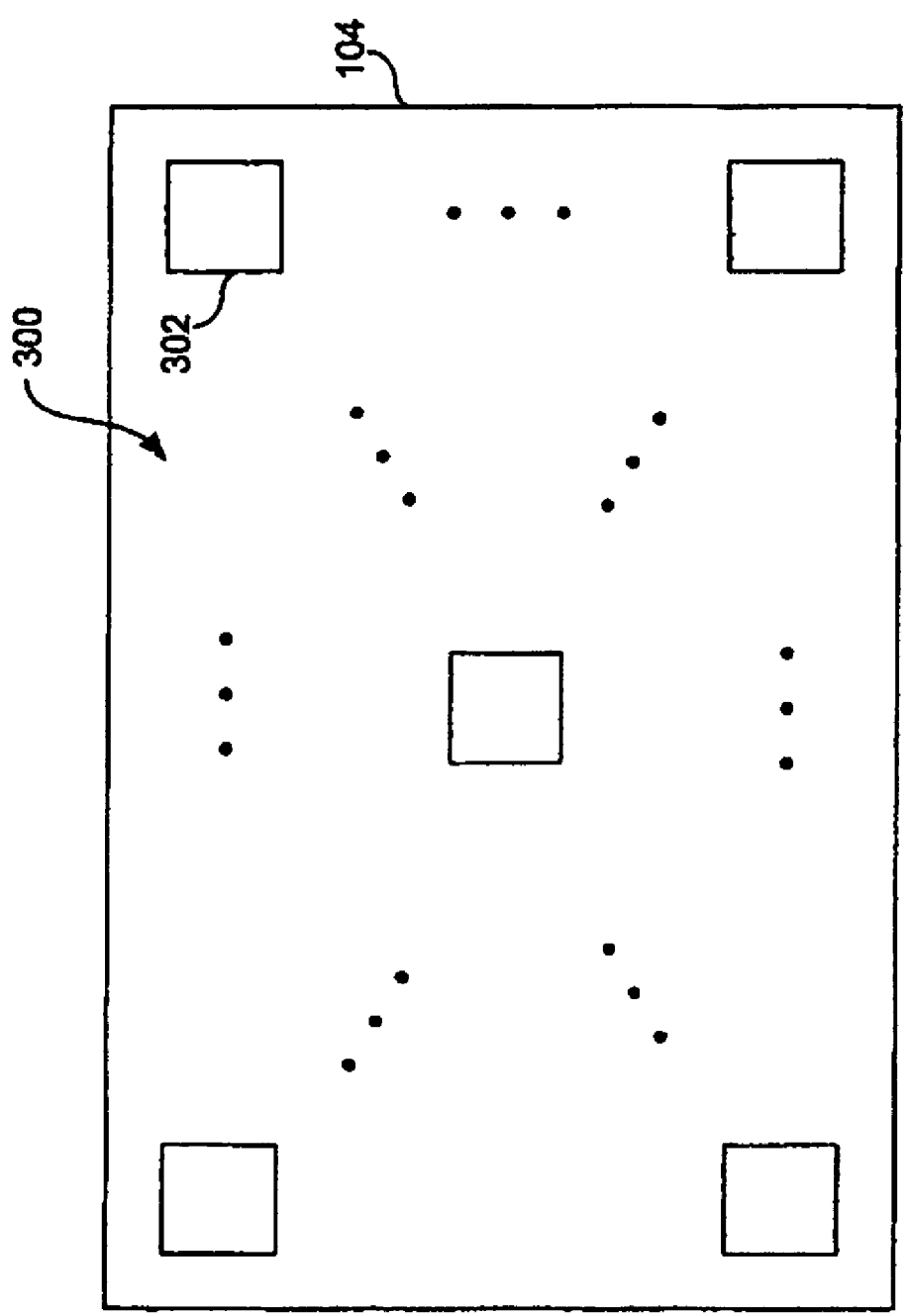
FIG. 10 is an illustration of a patterning array, according to one embodiment of the invention.

FIG. 10 shows details of an active area 300 of patterning array 104, for example. Active area 300 includes an n×m array of pixels 302 (represented by squares and series of dots in the figure). Pixels 302 can be mirrors on a DMD or locations on an LCD. By adjusting the physical characteristics of pixels 302, they can be seen as being in one of their states. Digital or analog input signals based on a desired pattern are used to switch states of the various pixels 302. In some embodiments, an actual pattern being written to object 112 can be detected and a determination can be made whether the pattern is outside an acceptable tolerance. If so, controller 116 can be used to generate analog or digital control signals in real time to fine-tune (e.g., calibrate, adjust, etc.) the pattern being generated by patterning array 104.

Figure 11:
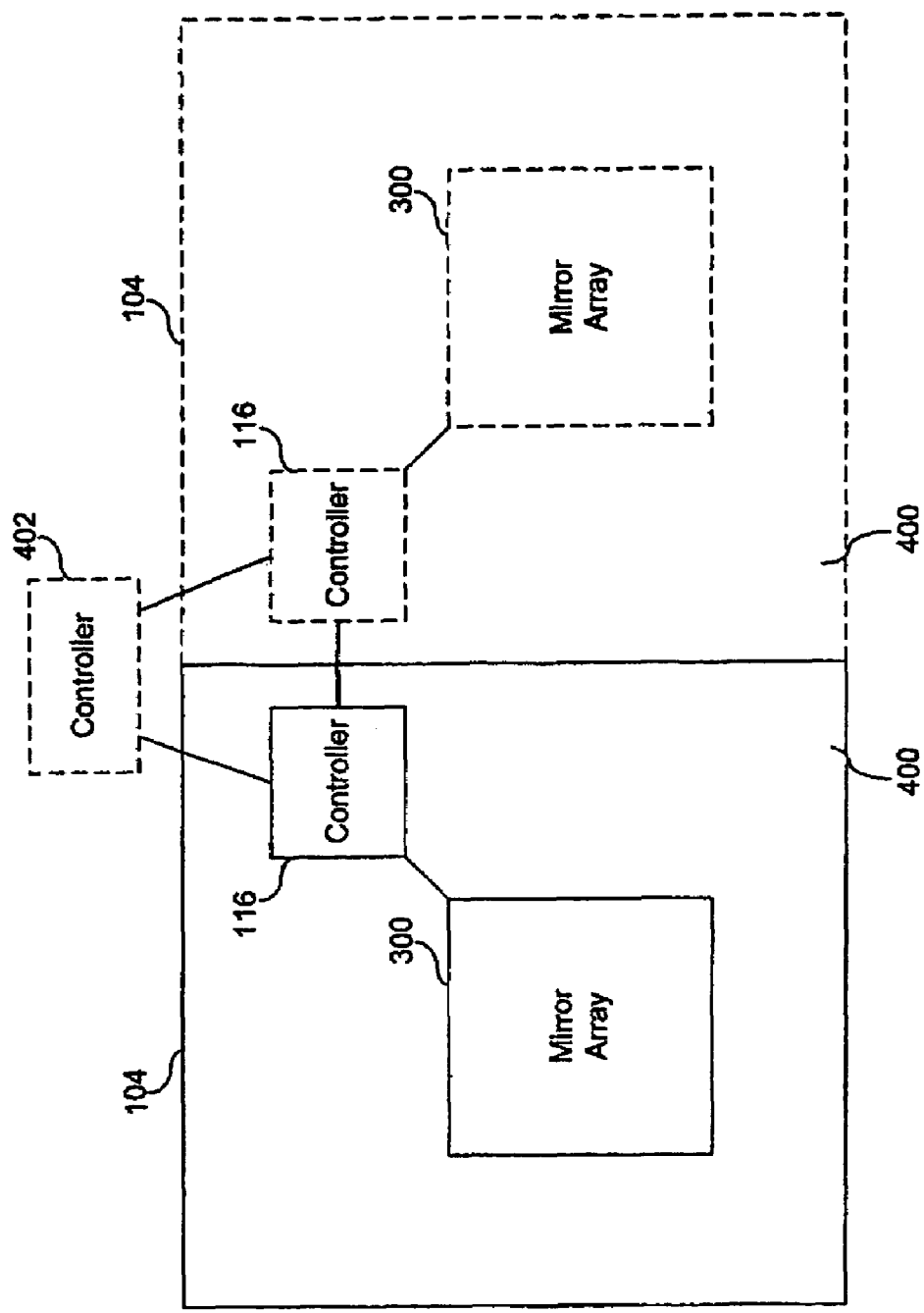
FIG. 11 is an illustration of further details of the patterning array in FIG. 10.

FIG. 11 shows further details of patterning array 104. Patterning array 104 can include an inactive packaging 400 surrounding active area (e.g., mirror array) 300. Also, in alternative embodiments, a main controller 402 can be coupled to each patterning array controller 116 to monitor and control an array of patterning arrays. The dashed lines in FIG. 11 represent a second patterning array in an array of patterning arrays. More than one patterning array can be added to the array to suit the implementation design. As discussed below, adjacent patterning arrays can be offset or staggered with respect to each other in other embodiments.

Figure 12:
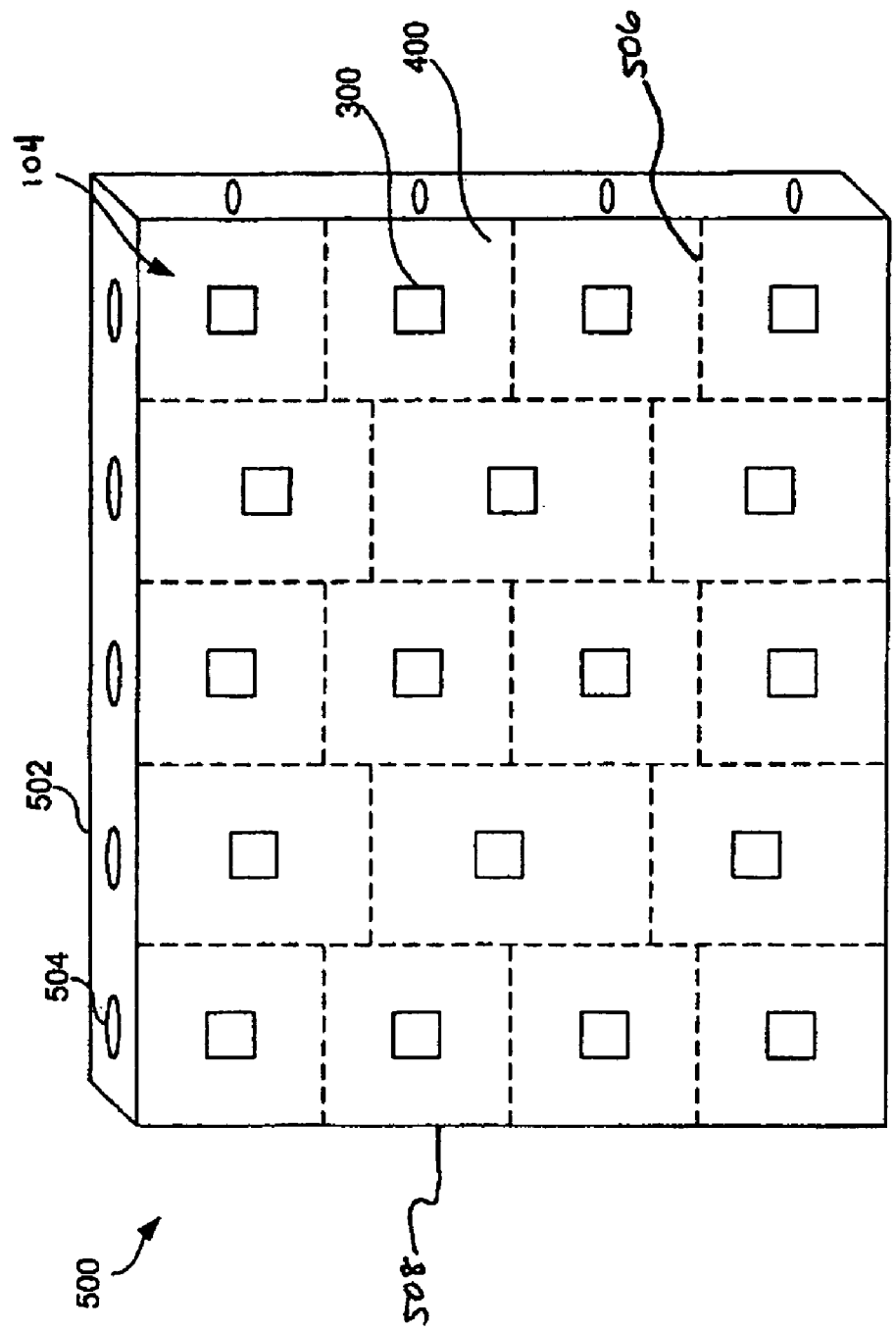
FIG. 12 is an illustration of an assembly, according to one embodiment of the invention.

FIG. 12 shows an assembly 500 including a support device 502 that supports or houses a patterning array assembly 508 including a plurality of patterning arrays 104. In various embodiments, as described in more detail below, patterning array assembly 508 can have varying numbers of columns, rows, patterning arrays per column, patterning arrays per row, etc., based on a number of desired exposures per pulse, or other implementation design criteria. The patterning arrays 104 can be coupled to a support device 502. Support device 502 can have thermal control areas 504 (e.g., water or air channels, structural heat sinks, etc.). Support device 502 can also have areas for control logic and related circuitry (e.g., see FIG. 11 showing elements 116 and element 402, which can be ASICs, A/D converters, D/A converters, fiber optics for streaming data, etc.). In addition, support device 502 can have openings 506 (formed within the dashed shapes) that receive patterning arrays 104, as is known in the relevant art. Support device 502, patterning arrays 104, and all peripheral cooling or control device circuitry are referred to as an assembly.

Assembly 500 can allow for a desired step size to produce the desired stitching (e.g., connecting of adjacent elements of features on object 112) and overlap for leading and trailing patterning arrays 104. A leading patterning array is the patterning array that produces the first image in a series of images on object 112 during a scan, and a trailing patterning array is the patterning array that produces the last image in a series of images on object 112 during a scan. Additional patterning arrays can be present between the leading and trailing patterning arrays. The overlap of the images from the leading and trailing patterning arrays 104 from different scans assists in removing seams that may result from adjacent, non-overlapping scans. Support device 502 can be used for thermal management based on being manufactured from a temperature stable material.

Support device 502 can be utilized as a mechanical backbone to ensure spacing control of patterning arrays 104 and for embedding the circuitry control and the thermal control areas 504. Any electronics can be mounted on either or both of a back side and a front side of support device 502. For example, when using analog-based patterning arrays or electronics, wires can be coupled from control or coupling systems 504 to active areas 300. Based on being mounted on support device 502, these wires can be relatively shorter, which reduces attenuation of analog signals compared to a case where the circuitry is remote from the support device 502. Also, having short links between the circuitry and active areas 300 can increase communication speed, and thus increase pattern readjustment speed in real time.

In some embodiments, when patterning array 104 or electrical devices in the circuitry wear out, assembly 500 can easily be replaced. Although it would appear that replacing assembly 500 is more costly than just a chip on assembly 500, it may in fact be more efficient to replace the entire assembly 500, which can save production costs. Also, assembly 500 can be refurbished, allowing for a reduction in replacement parts if end users are willing to use refurbished assemblies 500. Once assembly 500 is replaced, only an overall alignment is needed before resuming fabrication.

In a lithography system, such as system 100, any optical aberration in the system, such as total focus deviation or other focal aberrations, can result in significant error when the light in the system exposes object 112. Although focal aberrations are used herein as an example, it will be apparent to one of skill in the art that other optical aberrations may also be corrected with the present invention. The optics involved with the aberration may be, for example, patterning array optics 108 or projection optics 110. One method of correcting a focal aberration is to precisely adjust the relative positions of lenses in the optics, such as projection optics 110 or patterning array optics 108. In this way, the flat reticle plane (e.g., the plane of the location of patterning array assembly 508) is projected to a flat object focus plane. However, a lens adjustment may have the negative effect of causing a different aberration that must be corrected by further adjustment of the optics.

In an embodiment of the present invention, focal aberrations are not corrected by moving lenses in the optics. Instead, individual patterning arrays 104 are moved separately from patterning array assembly 508 to change the focus profile of the projected image. This creates a non-flat reticle plane designed to account for errors in the optics, and project onto a flat object focus plane.

Figure 13:
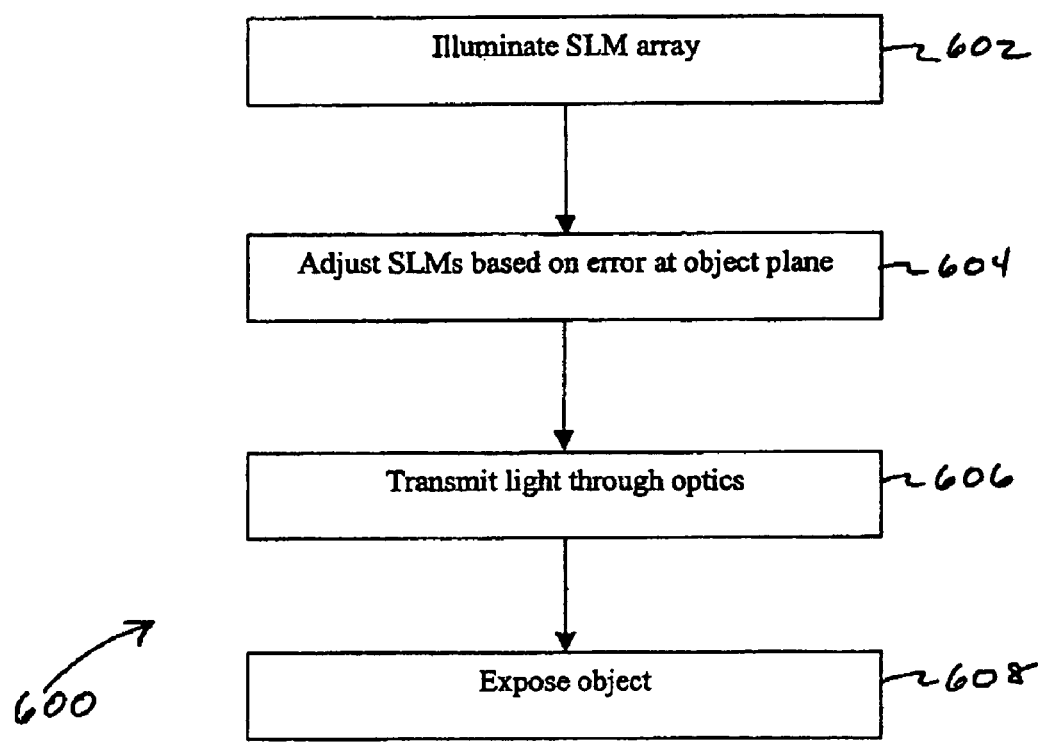
FIG. 13 is a flowchart of a method, according to one embodiment of the invention.

FIG. 13 is a flowchart of an example method 600 according to an embodiment of the present invention. In step 602, a patterning array assembly, such as patterning array assembly 508, is illuminated.

Figure 14:
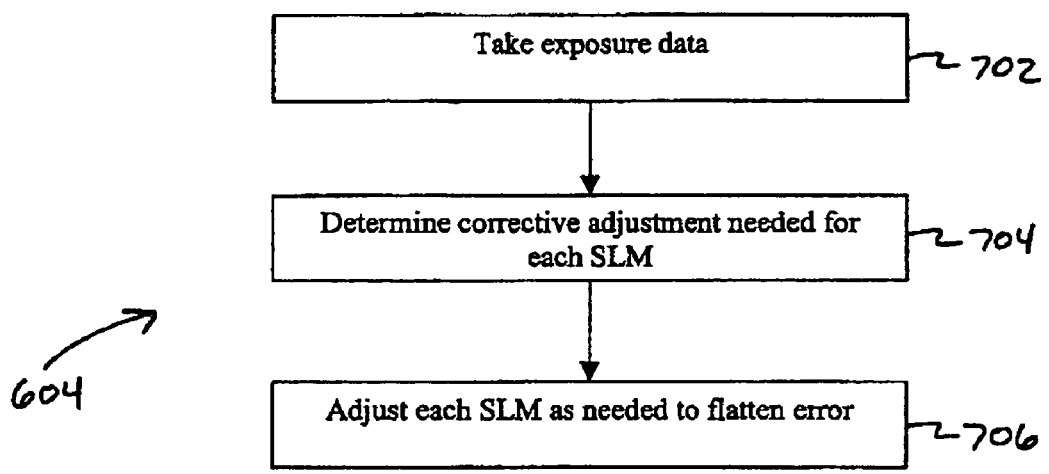
FIG. 14 is another flowchart of a method, according to one embodiment of the invention.

In step 604, the patterning arrays 104 in patterning array assembly 508 are adjusted based on an error or aberration in the exposure at the plane of object 112. FIG. 14 is a flowchart further detailing an embodiment of step 604. In step 702, exposure data is taken at the image plane. In an embodiment, exposure data is taken with a series of sensors. In an embodiment, exposure data is taken with a series of measurements by one or more sensors, which move within the exposure beam. For example, a detector moves up and down a slit of the exposure beam to determine points, if any, at which the beam is unfocused. In an embodiment, a test object 112 is exposed and then examined to determine the error or aberration data. In step 704, patterning array adjustments for each patterning array are determined. These adjustments may be required of one or multiple patterning arrays to correct for the aberration in the exposure. After the amount of adjustment is determined in step 704, each patterning array is adjusted in step 706 as needed to flatten or otherwise reduce the aberration. It is possible that some patterning arrays may need no adjustment. It is also possible that each patterning array will need some form of adjustment. Not every patterning array is required to be adjusted in the same manner as other patterning arrays, if at all. Step 604, and thus method 700, may be performed either before or after step 602.

In step 606 of method 600, after the patterning arrays have been adjusted, light reflected from patterning array assembly 508 is transmitted through the system optics, such as projection optics 110 or patterning array optics 108. In step 608, object 112 is exposed.

Method 600 can be performed upon initial setup of the maskless lithography system. Alternatively or additionally, method 600 can be performed periodically as needed for maintenance of the maskless lithography system. Alternatively, method 600 can also be performed before each exposure performed by the maskless lithography system.

Figure 15:
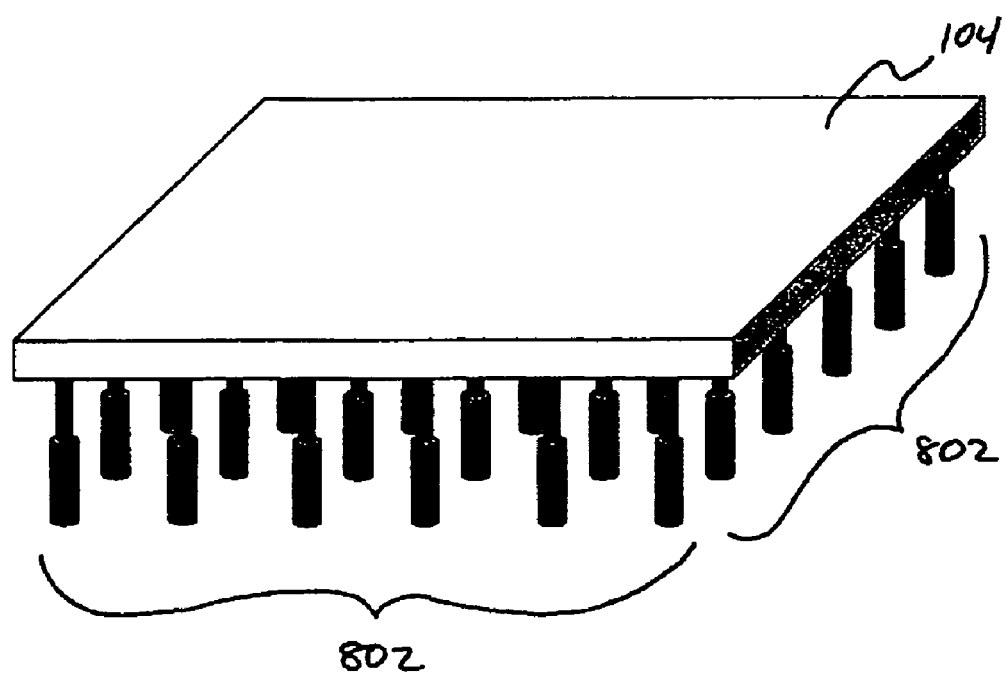
FIG. 15 is an illustration of a patterning array having a set of adjusters, according to one embodiment of the invention.

In order to adjust the individual patterning arrays 104, each patterning array 104 in patterning array assembly 508 may be mounted on an adjuster or a plurality of adjusters. FIG. 15 is an illustration of an example patterning array 104 according to this embodiment. In an embodiment, a single adjuster is used for each patterning array. In the alternative, as shown in FIG. 15, a plurality of adjusters 802 is attached to patterning array 104. Adjusters 802 extend so as to raise and lower parts of the patterning array to which they are attached. In an embodiment, adjusters 802 are active in that they are controlled by, for example, commands from a control system. Active adjusters may include, for example, pistons. The length of active adjusters can be changed during a scan. In an embodiment, adjusters 802 are passive in that they are controlled manually. Passive adjusters may include, for example, screws or bolts whose lengths are manually changed.

In an embodiment of the present invention, each patterning array 104 is mounted in a coplanar arrangement, such as that shown in FIG. 12. Although the invention is described according to this initial coplanar arrangement, one of skill in the art will recognize that each patterning array 104 may also be mounted in an initially non-planar arrangement. Individual patterning arrays 104 are then moved out of the coplanar arrangement as needed to correct for optical aberrations, such as total focal deviation, at the image plane. Movement of an individual patterning array 104 is achieved by changing the lengths of various ones of plurality of adjusters 802 that are attached to the patterning array 104.

The movement of patterning array 104 caused by adjusters 802 may be one of a planar movement, a tilting movement, or a bending movement, or it may be any combination of the three movements.

Figure 16B:
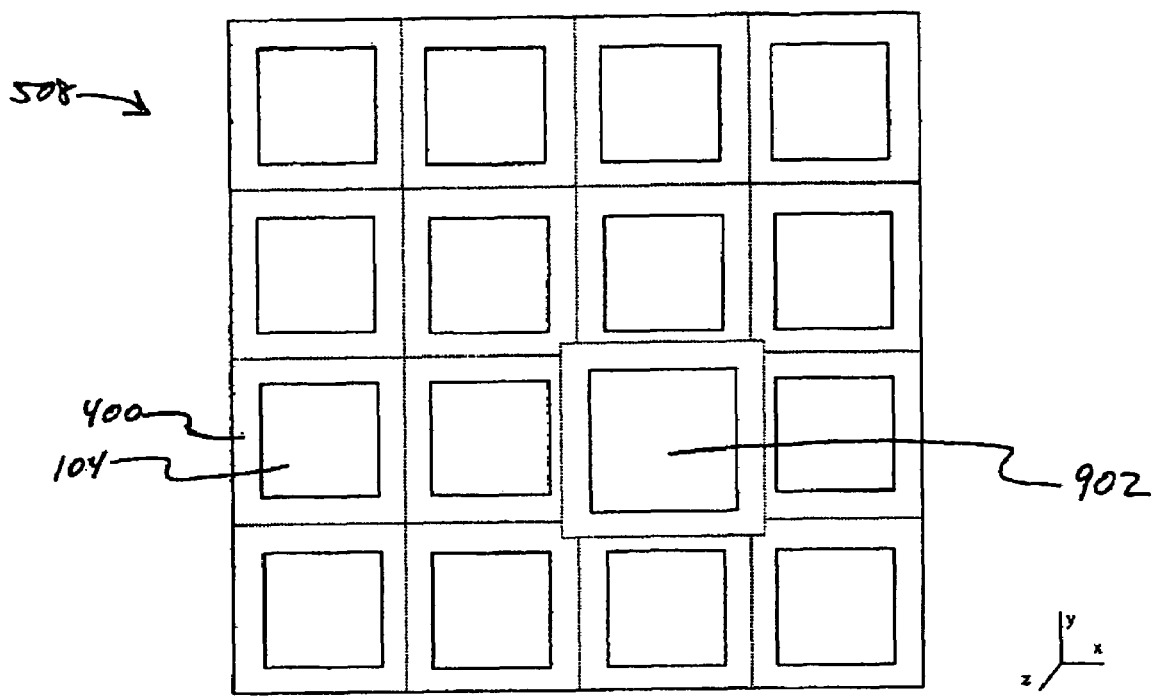
FIG. 16B is a cross-sectional illustration of a patterning array assembly, according to one embodiment of the invention.
Figure 16A:
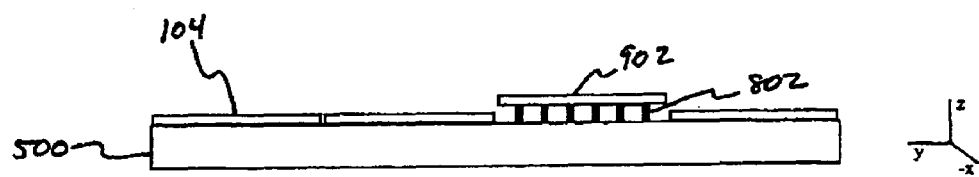
FIG. 16A is a frontal illustration of a patterning array assembly, according to one embodiment of the invention.

FIGS. 16A and 16B are perspective diagrams showing an embodiment of the present invention. As discussed above with respect to FIG. 12, patterning array assembly 508 can have varying numbers of patterning arrays per column and per row, and is not limited by the embodiments particularly described herein. In the example of FIG. 16A, patterning array assembly 508 includes 16 patterning arrays 104 surrounded by inactive packaging 400. In this example, each patterning array is the same size, with the rows and columns having an equal number of patterning arrays. FIG. 16A is a front view of patterning array assembly 508. FIG. 16B is a cross-sectional side view of patterning array assembly 508. In this embodiment, patterning array assembly 508 deviates from a flat plane in that patterning array 902 in patterning array assembly 508 is not coplanar with respect to other patterning arrays 104 in patterning array assembly 508. Instead, plurality of adjusters 802 elevate or de-elevate patterning array 902 to a new plane parallel to the plane of patterning array assembly 508. In this manner, optical aberrations in a particular area of the exposure can be corrected without changing the optics.

Figure 17A:
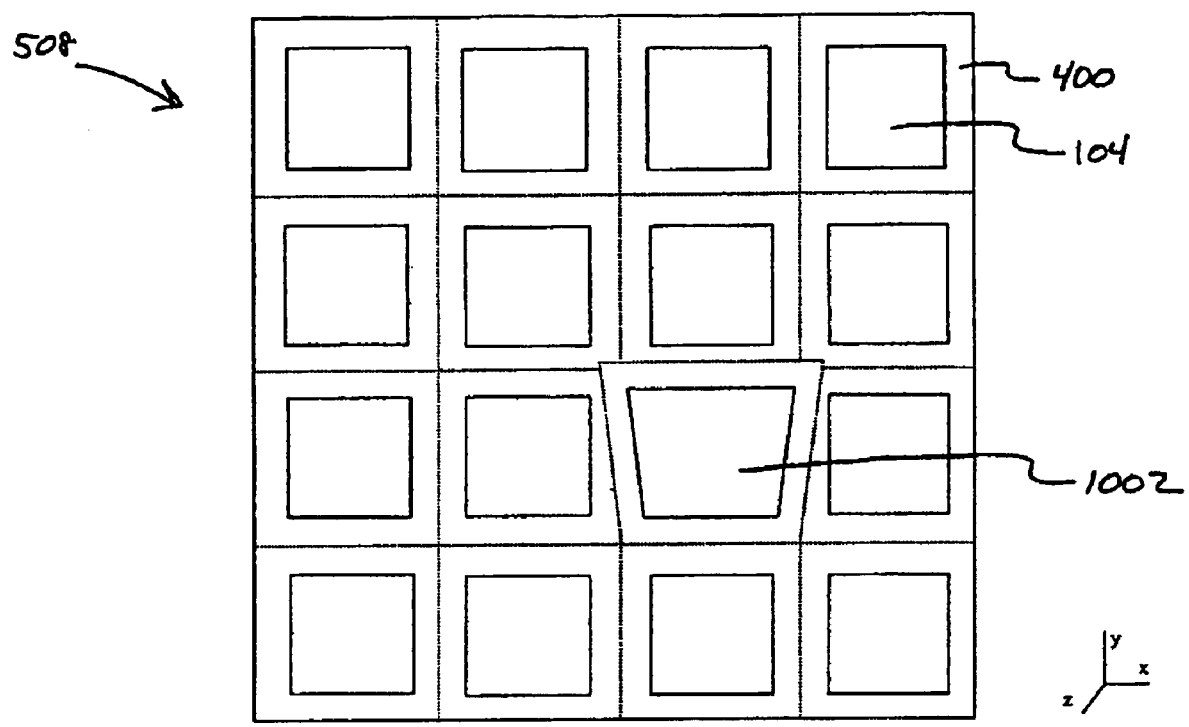
FIG. 17A is a frontal illustration of a patterning array assembly, according to one embodiment of the invention.
Figure 17B:
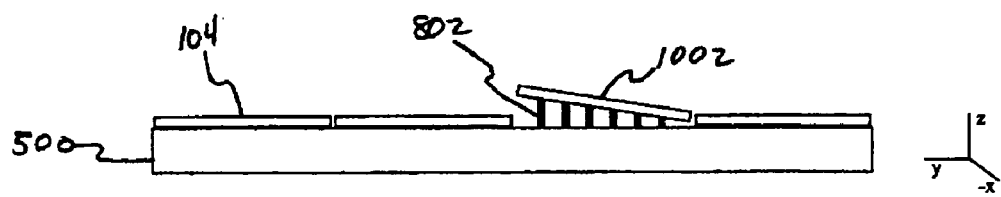
FIG. 17B is a cross-sectional illustration of a patterning array assembly, according to one embodiment of the invention.

FIGS. 17A and 17B are perspective diagrams showing another embodiment of the present invention. FIG. 17A is a front view of patterning array assembly 508. FIG. 17B is a cross-sectional side view of patterning array assembly 508. In this embodiment, patterning array assembly 508 deviates from a flat plane in that patterning array 1002 is tilted with respect to the plane of other patterning arrays 104 in patterning array assembly 508. In this example, patterning array 1002 is tilted in the y direction. One of skill in the art will recognize that patterning array 1002 may also be tilted in other directions, such as the x direction. To effect this tilt, plurality of adjusters 802 lengthen in proportion to their respective positions until the desired tilt angle is achieved.

Figure 18A:
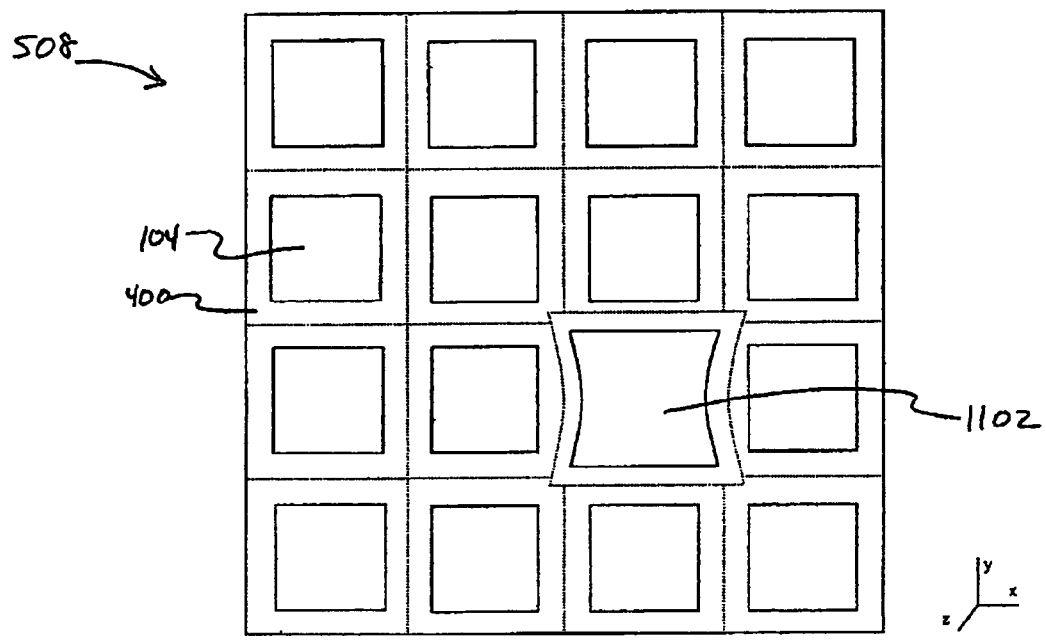
FIG. 18A is a frontal illustration of a patterning array assembly, according to one embodiment of the invention.
Figure 18B:
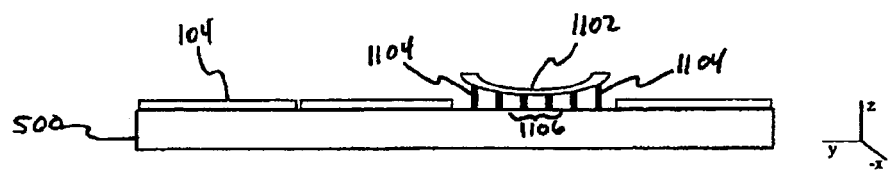
FIG. 18B is a cross-sectional illustration of a patterning array assembly, according to one embodiment of the invention.

FIGS. 18A and 18B are perspective diagrams showing another embodiment of the present invention. FIG. 18A is a front view of patterning array assembly 508. FIG. 18B is a cross-sectional side view of patterning array assembly 508. In this embodiment, patterning array assembly 508 deviates from a flat plane in that patterning array 1102 is bent with respect to the plane of other patterning arrays 104 in patterning array assembly 508. In the example of FIG. 18B, outer adjusters 1104, in the plurality of adjusters 802, lengthen, while inner adjusters 1106, in the plurality of adjusters 802, lengthen to a lesser extent or otherwise remain short relative to outer adjusters 1104. Each adjuster may have a different length than other adjusters. One of skill in the art will recognize that patterning array 1102 may be bent at a variety of places to achieve the desired result. For example, in an embodiment, patterning array 1102 may be either convex or concave. In an embodiment, patterning array 1102 may be curved on one side and flat on another.

One of skill in the art will recognize that each of the movements described (lifting, tilting, and bending) can be performed either separately or in conjunction with each other. Further, different patterning arrays in patterning array assembly 508 can move differently than other patterning arrays in patterning array assembly 508, depending on the amount of focal correction needed at the locations of the different patterning arrays.

The movement of the individual patterning arrays 104 causes the surface of patterning array assembly 508 to deviate from a flat plane in a controlled and predictable manner. This deliberate deviation from a flat plane changes the focus profile.

Changing the focus profile at the patterning array has several advantages. In systems where focal aberrations are corrected in the system optics, such as, for example, projection optics 110 and patterning array optics 108, the changes may result in other optical aberrations. Subsequent adjustments may again negatively affect the light path. Removing the task of focus correction from projection optics 110 and patterning array optics 108 to patterning arrays 104 decreases the amount of precision corrections that must be made to the optics.

Deviating from a flat plane and correcting for focal aberrations at patterning arrays 104 also allows a less stringent specification for the optics when the system is built. That is, the amount of acceptable error for each lens increases, and the accuracy required of each lens decreases. For example, if an exposure has an overall tolerance of ±100 nm, making adjustments solely in the optical system is both challenging and tedious. However, if the optics are allowed a tolerance of ±500 nm, with the remainder to be corrected by movement of the patterning arrays, the optics are simpler to design. This decrease in accuracy required by the optics saves time in both the manufacturing stage and the setup stage. Thus, the same error tolerance at object 112, formerly required by the optical system, can be achieved with an optical system designed to less strict specifications by using individual patterning arrays 104 to compensate for errors in the optics.

CONCLUSION

While specific embodiments of the invention have been described above, it will be appreciated that the invention may be practiced otherwise than as described. The description is not intended to limit the invention.

What is claimed is:

1. A lithographic apparatus, comprising:
an illumination system that supplies a beam of radiation;
a patterning array of individually controllable elements having an active surface, the active surface being configured to pattern the beam;
a mounting plate on which said patterning array is mounted;
an adjustment structure that elevates or deforms at least a portion of the active surface of said patterning array, wherein the adjustment structure comprises an array of vertically extensible adjusters in contact with a side opposite of the active surface of said patterning array; and
a projection system that projects the patterned beam onto a target portion of a substrate.

2. The apparatus of claim 1, wherein said adjustment structure comprises:
a level sensor to detect unflatness in the patterning array; and
a feedback loop to control the elevation or deformation applied to the patterning array.

3. The apparatus of claim 1, wherein said adjustment structure comprises an array of piezoelectric elements.

4. The apparatus of claim 1, wherein said adjustment structure comprises an array of fasteners passing through threaded holes in the mounting plate that bear against the patterning array.

5. The apparatus of claim 1, further comprising:
a plurality of the patterning arrays provided on a common mounting member, and
respective adjustment structures, whereby the adjustment structures allow the plurality of the patterning arrays to be mutually leveled.

6. The apparatus of claim 1, further comprising:
a detection device configured to detect focus aberrations of the lithographic apparatus and produce a control signal therefrom, wherein the adjustment structure is configured to utilize the control signal to perform the elevation or deformation.

7. A device manufacturing method, comprising:
elevating or deforming an active surface of a patterning array of individually controllable elements using an array of vertically extensible adjusters in contact with a side opposite of the active surface of said patterning array;
patterning a beam of radiation using the active surface of the patterning array; and
projecting the patterned beam onto a target portion of a substrate.

8. The method of claim 7, further comprising:
measuring a focus aberration of the patterned beam at the substrate; and
performing the elevating or the deforming step based on the measured focus aberration.

9. The method of claim 8, providing at least some correction for the measured focus aberration based on the elevating or the deforming step.

10. The method of claim 7, further comprising:
detecting unflatness of the active surface of the patterning array; and
performing the elevating or the deforming step based on the detected unflatness.

11. The method of claim 10, further comprising reducing the detected unflatness of the active surface based on the elevating or the deforming.

12. The lithographic apparatus of claim 1, wherein the adjustment structure elevates or de-elevates the portion of the active surface to a new plane parallel with a plane of the patterning array.

13. The lithographic apparatus of claim 1, wherein the adjustment structure deforms the portion of the active surface of the patterning array to produce a non-planar surface.

14. A lithographic apparatus, comprising:

an illumination system configured to supply a beam of radiation;

a patterning array of individually controllable elements having an active surface, the active surface being configured to pattern the beam;

a mounting plate on which the patterning array is mounted;

an adjustment structure configured to (i) elevate or de-elevate at least a portion of the active surface of the patterning array to a new plane parallel to a plane of the patterning array or (ii) deform at least a portion of the active surface of the patterning array to produce a non-planar surface, wherein the adjustment structure comprises an array of vertically extensible adjusters in contact with a side opposite of the active surface of the patterning array; and a projection system that projects the patterned beam onto a target portion of a substrate.

* * * * *